United States Patent
Nishiyama et al.

(10) Patent No.: US 10,729,049 B2
(45) Date of Patent: Jul. 28, 2020

(54) COMPONENT MOUNTING DEVICE

(71) Applicant: FUJI CORPORATION, Chiryu-shi (JP)

(72) Inventors: Satoru Nishiyama, Nagoya (JP); Hidetoshi Kawai, Chiryu (JP); Kazuhiro Kusunoki, Toyoake (JP)

(73) Assignee: FUJI CORPORATION, Chiryu-shi (JP)

( * ) Notice: Subject to any disclaimer, the term of this patent is extended or adjusted under 35 U.S.C. 154(b) by 342 days.

(21) Appl. No.: 15/738,439

(22) PCT Filed: Jul. 7, 2015

(86) PCT No.: PCT/JP2015/069559
§ 371 (c)(1),
(2) Date: Dec. 20, 2017

(87) PCT Pub. No.: WO2017/006439
PCT Pub. Date: Jan. 12, 2017

(65) Prior Publication Data
US 2018/0279521 A1    Sep. 27, 2018

(51) Int. Cl.
*B23P 19/00* (2006.01)
*H05K 13/04* (2006.01)
(Continued)

(52) U.S. Cl.
CPC ..... *H05K 13/0417* (2013.01); *H05K 13/0061* (2013.01); *H05K 13/04* (2013.01);
(Continued)

(58) Field of Classification Search
CPC ............. H05K 13/0409; H05K 13/041; H05K 13/0408; H05K 13/0413; H05K 13/0815;
(Continued)

(56) References Cited

U.S. PATENT DOCUMENTS 10,216,159 B2 *   2/2019   Tsuji .................. G07C 3/04
10,412,869 B2 *   9/2019   Kamio ............... H05K 13/0404
(Continued)

FOREIGN PATENT DOCUMENTS

| CN | 1767761 A | 5/2006 |
| JP | 61-219591 | 9/1986 |

(Continued)

OTHER PUBLICATIONS

Extended European Search Report dated Feb. 21, 2019 in Patent Application No. 15897702.5, 8 pages.
(Continued)

*Primary Examiner* — Thiem D Phan
(74) *Attorney, Agent, or Firm* — Oblon, McClelland, Maier & Neustadt, L.L.P.

(57) ABSTRACT

In component mounting device, if a rotary head held by a head holder greatly deviates from a specified reference, a CPU executes a process for a holding error. The process for the holding error includes a process of holding a rotary head again by the head holder or the like, for example. If the rotary head greatly deviates from a specified reference and the component mounting process is executed as is, there is a fear that poor precision will occur during component mounting. Therefore, the CPU does not execute the component mounting process but executes the process for the holding error.

6 Claims, 6 Drawing Sheets

(51) Int. Cl.
*H05K 13/00* (2006.01)
*H05K 13/08* (2006.01)

(52) U.S. Cl.
CPC ......... *H05K 13/0404* (2013.01); *H05K 13/08* (2013.01); *Y10T 29/53174* (2015.01)

(58) Field of Classification Search
CPC ......... Y10T 29/53174; Y10T 29/53191; Y10T 29/49998; Y10T 29/53; Y10T 29/5313; Y10T 29/4913
USPC ......... 29/739, 428, 705, 714, 740, 743, 829, 29/832, 834, 837
See application file for complete search history.

(56) References Cited

U.S. PATENT DOCUMENTS

2016/0219761 A1    7/2016    Nishiyama
2016/0227684 A1    8/2016    Kamio

FOREIGN PATENT DOCUMENTS

WO    WO 2015/004814 A1    1/2015
WO    2015/049721 A1    4/2015

OTHER PUBLICATIONS

International Search Report dated Oct. 13, 2015 in PCT/JP2015/069559 filed Jul. 7, 2015.

* cited by examiner

COMPONENT MOUNTING DEVICE

TECHNICAL FIELD

The present invention relates to a component mounting device.

BACKGROUND ART

Conventionally, a component mounting device that can automatically exchange a head is known. For example, in the component mounting device of PTL 1, in a case where exchange to a head for which calibration data has not been created is performed, creation of the calibration data of the head is performed and the head is controlled using the calibration data. On the other hand, in a case where exchange to a head for which calibration data has already been created is performed, the calibration data is corrected based on a deviation amount between the head after exchange and the head when the calibration data was created, and the head is controlled by using the calibration data after the correction.

CITATION LIST

Patent Literature

PTL 1: Pamphlet of WO2015/49721

SUMMARY OF INVENTION

Technical Problem

However, if the deviation amount of the head after exchange is too large, even if the calibration data is corrected, sufficient precision may not be obtained during component mounting.

The present invention solves the problem described above and a main object thereof is to prevent an occurrence of poor precision during component mounting when the head greatly deviates from a specified reference.

Solution to Problem

According to the invention, there is provided a component mounting device including: a head that has a nozzle capable of picking up a component, a head holding means configured to hold and release the head, and a control means configured to determine whether the head held by the head holding means deviates from a specified reference beyond an allowable range and execute a process for a holding error rather than a component mounting process if the deviation exceeds the allowable range.

With the component mounting device, if the head held by the head holding means deviates from a specified reference beyond an allowable range, the process for the holding error is executed. In other words, when the head deviates greatly from a specified reference, since there is a fear that poor precision will occur during component mounting if the component mounting process is executed as is, the process for the holding error is executed instead of the component mounting process. Accordingly, poor precision during component mounting can be prevented when the head greatly deviates from a specified reference.

In the component mounting device of the invention, the control means may execute a process of controlling the head holding means so that the head holding means holds the head again, as the process for the holding error. In this way, the deviation of the head from a specified reference may fall within the allowable range by holding the head again by the head holding means. If the deviation falls within the allowable range, poor precision does not occur during a subsequent component mounting process.

In the component mounting device of the invention, the control means may execute a process of externally notifying the fact that the holding error has occurred, as the process for the holding error. In this way, since an operator knows from the external notification that a holding error has occurred, it is possible to take suitable countermeasures against the holding error.

In the component mounting device of the invention, the specified reference may be a specified position of the head holding means. In this way, the control means can grasp the deviation of the head with respect to the head holding means.

In the component mounting device of the invention, the specified reference may be a predetermined position of the head held by the head holding means when head position correction data is created. In this way, the control means can grasp the deviation of this head with respect to the head when the head position correction data is created.

DESCRIPTION OF EMBODIMENTS

Figure 1:
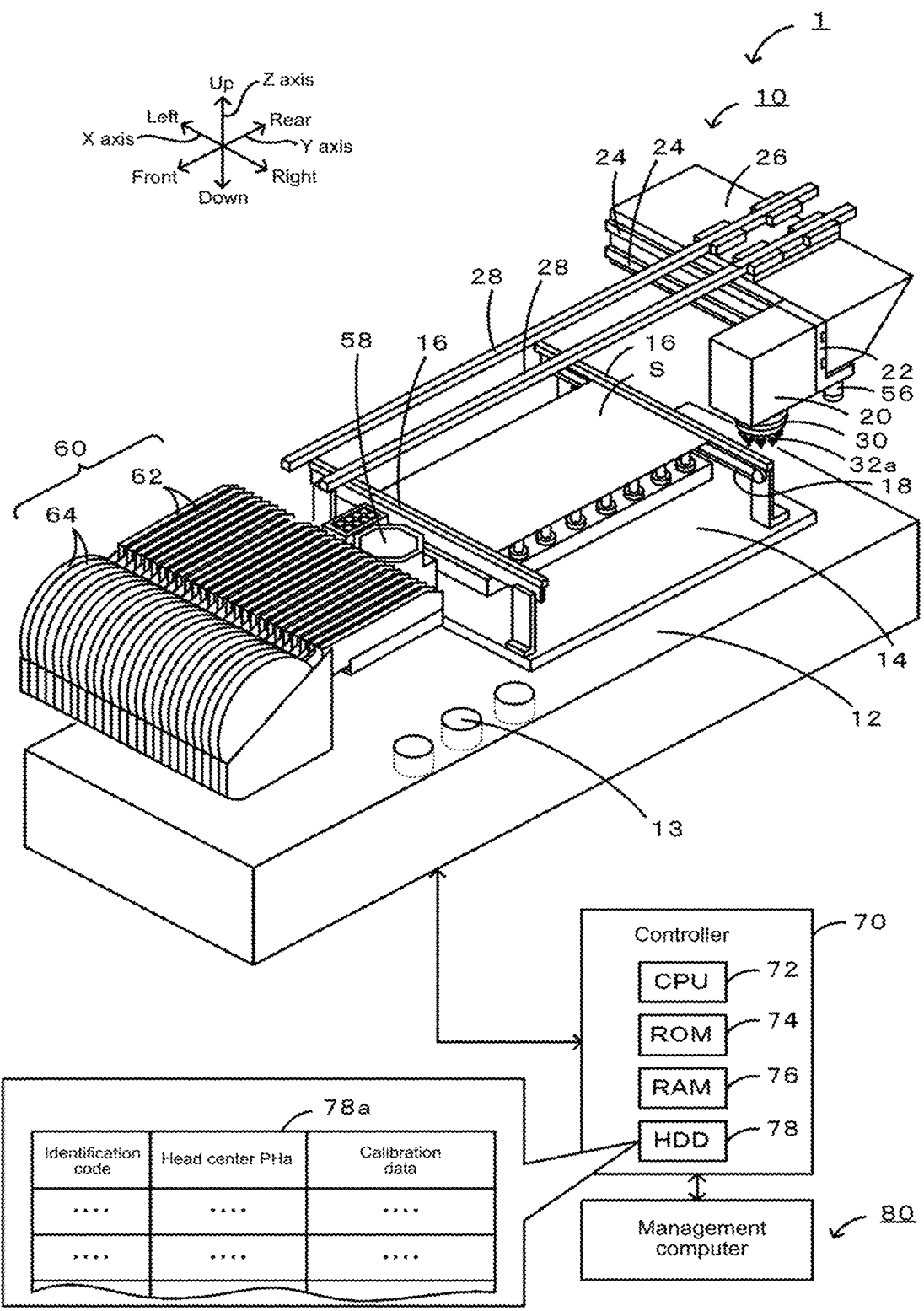
FIG. 1 is an explanatory view illustrating the overall configuration of component mounting system 1.

Preferred embodiments of the invention will be described below with reference to the drawings. FIG. 1 is an explanatory view illustrating the overall configuration of component mounting system 1. In this embodiment, a left-right direction (X axis), a front-rear direction (Y axis), and an up-down direction (Z axis) are as illustrated in FIG. 1.

Component mounting system 1 includes component mounting device 10 and management computer 80.

As illustrated in FIG. 1, the component mounting device 10 includes board conveyance device 14 that is installed on base 12, head unit 20 that can move in an XY plane, rotary head 30 that is detachably attached to head unit 20, mark camera 56 that images a board S from above, component camera 58 that images components held by nozzle 32a from below, component supply device 60 that supplies components to be mounted on the board S, and controller 70 that executes various kinds of control.

Board conveyance device 14 conveys the board S from left to right by conveyor belts 18 and 18 (only one of them is illustrated in FIG. 1) attached to a pair of front and rear support plates 16 and 16, respectively.

Head unit 20 is attached to X-axis slider 22, moves in the left-right direction as X-axis slider 22 moves along guide rails 24 and 24 in the left-right direction, and moves in the front-rear direction as Y-axis slider 26 moves along guide rails 28 and 28 in the front-rear direction. Therefore, head unit 20 can move in the XY-plane. Each of the sliders 22 and 26 is driven by a servomotor (not illustrated). In addition, each of the sliders 22 and 26 has a linear encoder (not illustrated) so that a position of each of the sliders 22 and 26 can be recognized based on the output pulse of the linear encoder.

Rotary head 30 is a member having a substantially cylindrical outer shape and is provided with multiple nozzles 32a in a circumferential direction. Rotary head 30 is attached to head unit 20 to be rotatable and detachable. In a state where rotary head 30 is not attached to head unit 20, rotary head 30 is stored in head storage area 13 provided on an upper right side of base 12.

Mark camera 56 is attached to a lower face of X-axis slider 22. The lower side of mark camera 56 is an imaging area, and mark camera 56 is a camera that reads a mark on board S. The mark indicates a reference position on the board S. The reference position is used when mounting the component held by nozzle 32a to a desired position on the board S. Mark camera 56 also has a function of a bar code reader that reads a two-dimensional bar code attached to various heads.

Component camera 58 is disposed on a front side of board conveyance device 14. Component camera 58 images a state of the component held by the nozzle 32a when the nozzle 32a which is holding the component passes above component camera 58. The image captured by component camera 58 is used to determine whether the component is normally picked up, for example. In addition, component camera 58 images a bottom face of head holder 54 (see FIG. 3) that does not hold rotary head 30 and images a bottom face of rotary head 30 held by head holder 54.

The component supply device 60 is attached to a front side of the component mounting device 10. Component supply device 60 has multiple slots, and a feeder 62 can be inserted into each slot. Reel 64 around which a tape is wound is attached to feeder 62. On the surface of the tape, components are held in a state aligned in a longitudinal direction of the tape. These components are protected by a film covering a surface of the tape. Such a tape is fed backward by a sprocket mechanism (not illustrated), the film is peeled off, and the component is placed at a predetermined component supply position in an exposed state. The component supply position is a position where nozzle 32a can pick up the component. Nozzle 32a which picks up the component at the component supply position mounts the component at a predetermined position on the board S.

Controller 70 includes CPU 72 that executes various controls, ROM 74 that stores a control program and the like, RAM 76 that is used as a work area, and HDD 78 that stores a large amount of data, these items are connected by a bus (not illustrated). Controller 70 is connected so as to be capable of exchanging signals with board conveyance device 14, X-axis slider 22, Y-axis slider 26, head unit 20, mark camera 56, component camera 58 and component supply device 60.

Management computer 80 is a computer that manages the production job of the board S and stores production job data created by the operator. With component mounting device 10, what components are mounted on what board type of the board S in what order from a feeder at which slot position and, in addition, how many sheets of the board S mounted as described above are manufactured are defined in the production job data. Management computer 80 is connected to controller 70 of component mounting device 10 and a controller (not illustrated) of feeder 62 such that two-way communication is possible.

Figure 2:
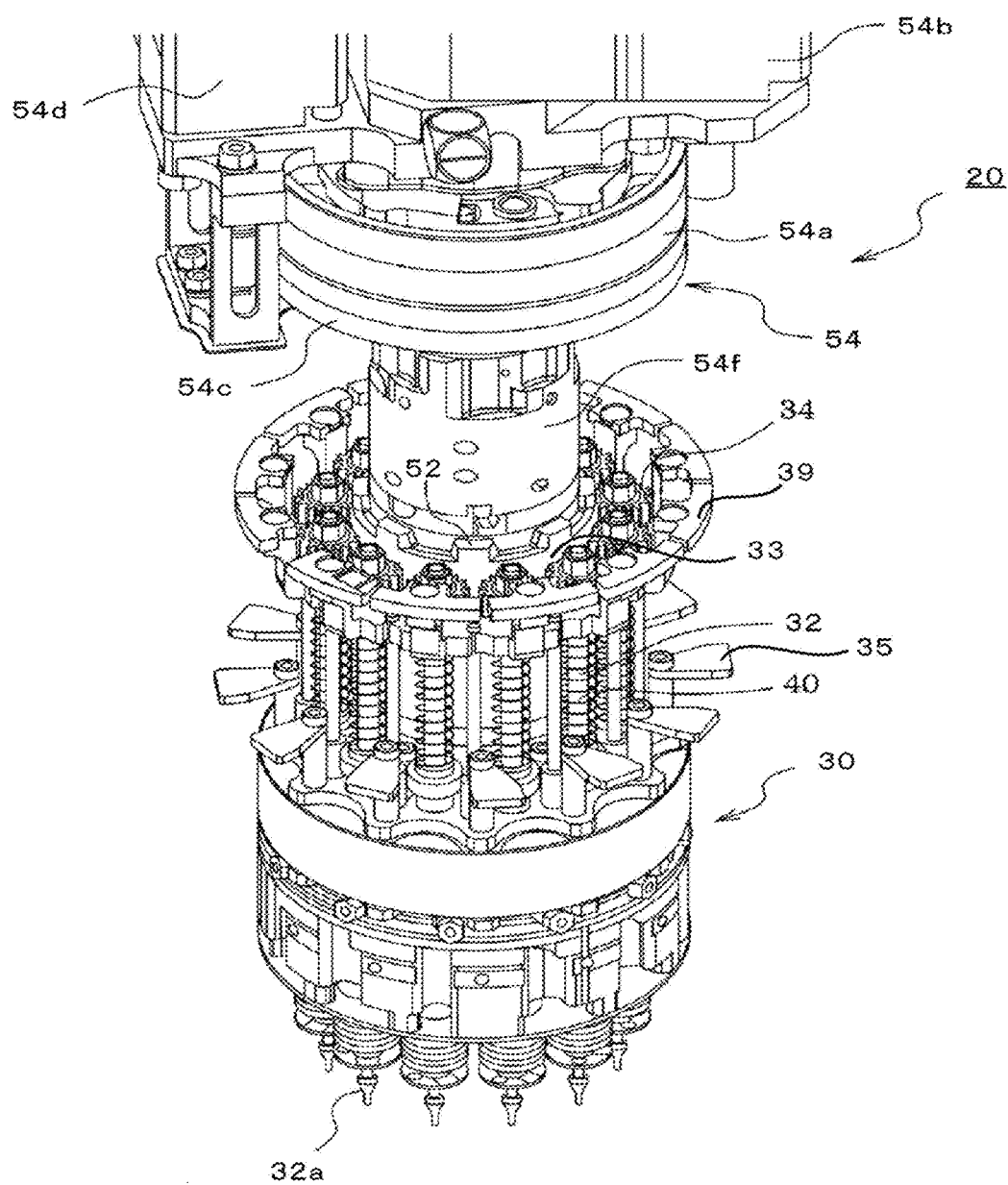
FIG. 2 is a perspective view of head unit 20 in a state where the cover is removed.
Figure 3:
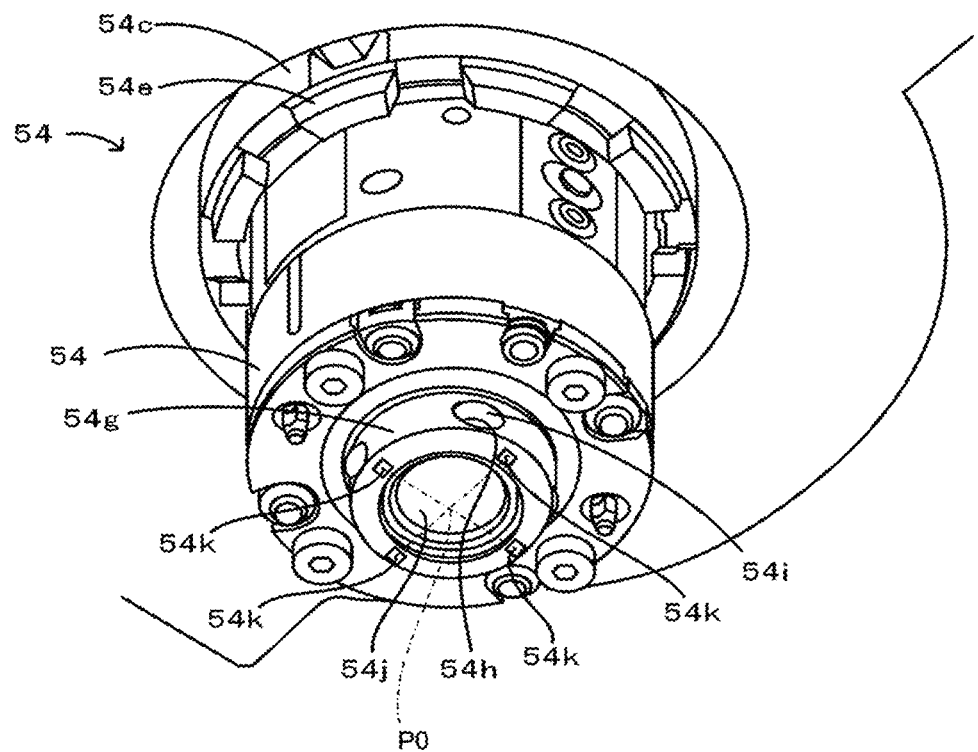
FIG. 3 is a perspective view when head holder 54 is viewed diagonally upward from below.
Figure 4:
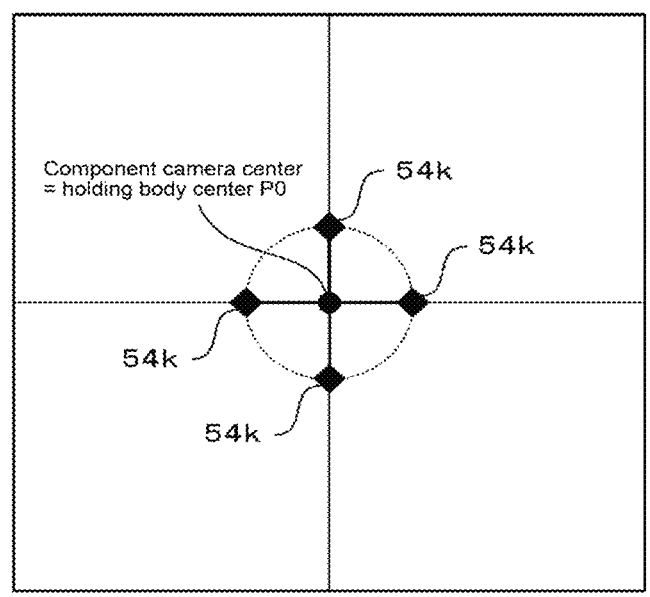
FIG. 4 is a captured image of component camera 58 when holder center P0 is made to coincide with a center of component camera 58.
Figure 5:
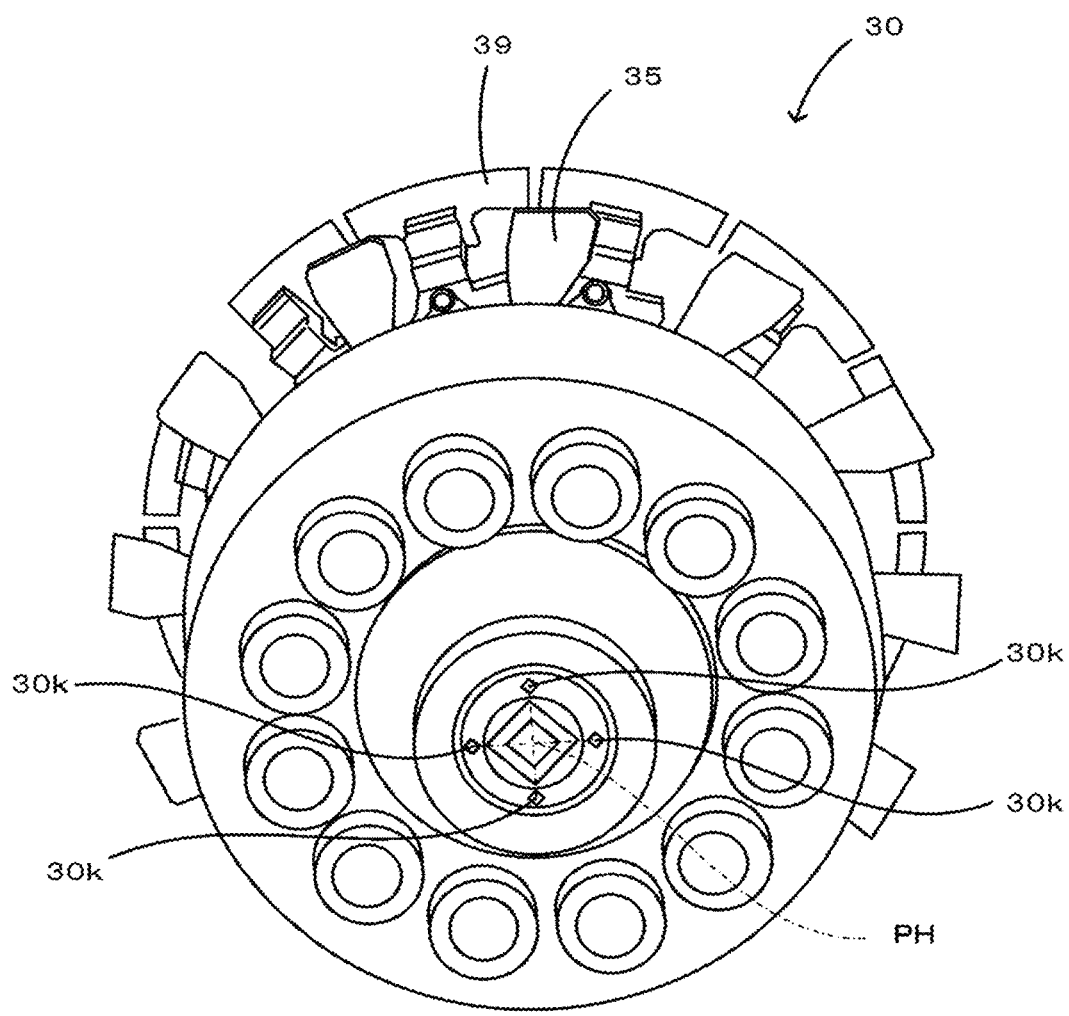
FIG. 5 is a perspective view when rotary head 30 is viewed diagonally upward from below.

Here, head unit 20 will be described in detail. FIG. 2 is a perspective view of head unit 20 in a state where the cover is removed and is specifically a perspective view when rotary head 30 is attached to R-shaft 54f of head holder 54. FIG. 3 is a perspective view when head holder 54 is viewed diagonally upward from below, FIG. 4 is a captured image of component camera 58 when holder center P0 is made to coincide with the center of component camera 58, and FIG. 5 is a perspective view when the rotary head 30 is viewed diagonally upward from below. In FIG. 5, nozzle 32a is omitted.

As illustrated in FIG. 2, head unit 20 includes head holder 54 and rotary head 30. Rotary head 30 is a member also referred to as an auto tool.

Head holder 54 is attached to X-axis slider 22 (see FIG. 1) so as to be capable of being lifted and lowered by a lifting and lowering mechanism (not illustrated). As illustrated in FIG. 2, head holder 54 has two ring-shaped gears, R-shaft gear 54a and Q-shaft gear 54c at an upper section thereof, and cylindrical R-shaft 54f at a lower section thereof. R-shaft gear 54a is rotationally driven by R-shaft motor 54b and is rotated integrally with R-shaft 54f. Q-shaft gear 54c is rotationally driven by Q-shaft motor 54d and is rotated integrally with ring-shaped clutch member 54e (see FIG. 3) provided on the lower face of Q-shaft gear 54c. Q-shaft gear 54c is rotatable independently of R-shaft gear 54a. As illustrated in FIG. 3, R-shaft 54f has tubular protrusion 54g at the lower section. On the cylindrical surface of tubular protrusion 54g, four holes 54h are provided at equal intervals in the circumferential direction. In each hole 54h, clamp ball 54i having a diameter larger than the hole diameter is attached so as to protrude/retract from hole 54h. Piston 54j that moves up and down by air pressure is disposed inside tubular protrusion 54g. Piston 54j has a tapered surface at a position contacting clamp ball 54i. When the up-down position of piston 54j is changed, the degree to which clamp ball 54i is pressed by the tapered surface is changed. Therefore, by controlling the up-down position of piston 54j, clamp ball 54i is made to protrude from hole 54h to engage rotary head 30 with R-shaft 54f, or clamp ball 54i is retracted into hole 54h to disengage rotary head 30 and R-shaft 54f from each other. In addition, on the ring-shaped bottom face of tubular protrusion 54g, four R-shaft marks 54k are provided at equal intervals in the circumferential direction. The holder center P0 is the intersection point of the lines connecting the diagonally related two of the four R-shaft marks 54k (one-dot chain line in FIG. 3).

Here, holder center P0 will be described. In a state where rotary head 30 is not mounted on head holder 54, controller 70 controls X-axis Y-axis sliders 22 and 26 so that center P0 coincides with the center of component camera 58, as illustrated in FIG. 4. Controller 70 preserves a pulse value of a linear encoder (not illustrated) of each of the sliders 22 and 26 when holder center P0 coincides with the center of component camera 58 as a reference pulse value in HDD 78. Thereafter, if controller 70 controls X-axis and Y-axis sliders 22 and 26 so that the pulse value outputted from the linear encoders of X-axis and Y-axis sliders 22 and 26 coincide with the reference pulse value, holder center P0 can be made coincident with the center of component camera 58. Therefore, even in a case where head holder 54 holds rotary head 30 and R-shaft mark 54k does not appear on component camera 58, holder center P0 can be made coincident with the center of the component camera.

As illustrated in FIG. 2, rotary head 30 has multiple (12 in this case) nozzles 32a. Nozzle 32a is integrated with nozzle holder 32 extending in the up-down direction. Nozzle holder 32 has nozzle operation lever 39 in the vicinity of an upper end thereof and is biased upward by spring 40 to be positioned at a specified regular position (upper position). Nozzle operation lever 39 is pushed down and released by a pressing mechanism (not illustrated) provided in head unit 20. The pressing mechanism is controlled by controller 70. When nozzle operation lever 39 is pushed down, nozzle holder 32 and nozzle 32a are lowered against the elastic force of spring 40 and when the pushing down of nozzle operation lever 39 is released, nozzle holder 32 and nozzle 32a are returned to the regular position by the elastic force of spring 40. Nozzle holder 32 has small gear 34 coaxial with nozzle holder 32. Cylindrical gear 33 is disposed inside a circumference around which small gears 34 are lined up, has teeth on a side surface thereof, and engages with small gears 34. In addition, cylindrical gear 33 is designed with dimensions so that R-shaft 54f can be inserted and is rotatable independently of R-shaft 54f. Clutch member 52 that mates with clutch member 54e (see FIG. 3) of head holder 54 is provided on an upper end of cylindrical gear 33. In addition, rotary head 30 has pressure operation lever 35 that switches to and from supplying negative pressure or atmospheric pressure to the nozzle tip for each nozzle 32a. Pressure operation lever 35 is positioned by a switching mechanism (not illustrated) provided in head unit 20. The switching mechanism is controlled by controller 70. When positioned above, pressure operation lever 35 supplies a negative pressure to the nozzle tip, and when positioned below, pressure operation lever 35 supplies atmospheric pressure to the nozzle. As illustrated in FIG. 5, four head marks 30k are provided on the ring-shaped bottom face of rotary head 30 at equal intervals in the circumferential direction. The head center PH is an intersection point of the lines connecting the diagonally related two of the four head marks 30k (one-dot chain line in FIG. 5).

Such a rotary head 30 is mounted on head holder 54 by the following procedure. First, the controller 70 moves head unit 20 right above rotary head 30 in a state where rotary head 30 is not held by head holder 54 and rotary head 30 is stored in head storage area 13. Subsequently, controller 70 lowers head holder 54, inserts R-shaft 54f into cylindrical gear 33, and causes clutch member 52 of cylindrical gear 33 to mesh with clutch member 54e of head holder 54. Subsequently, controller 70 actuates piston 54j so that clamp ball 54i of head holder 54 protrudes radially outward from hole 54h. Accordingly, head holder 54 and rotary head 30 are engaged with each other via clamp ball 54i and rotary head 30 is held by head holder 54. When R-shaft gear 54a of head holder 54 is rotated in this state, the entire rotary head 30 is rotated, and when Q-shaft gear 54c is rotated, nozzles 32 are rotated independently via cylindrical gear 33 and small gears 34.

In addition, rotary head 30 is released from head holder 54 by the following procedure. First, by controller 70, rotary head 30 is held by head unit 20, and rotary head 30 is moved right above the storage space in a state where storage space of rotary head 30 is empty in head storage area 13. Subsequently, controller 70 lowers head holder 54 to store rotary head 30 in the storage space and actuates piston 54j so that clamp ball 54i of head holder 54 retracts inward in the radial direction from hole 54h. Accordingly, the engagement between head holder 54 and rotary head 30 is released.

Figure 6:
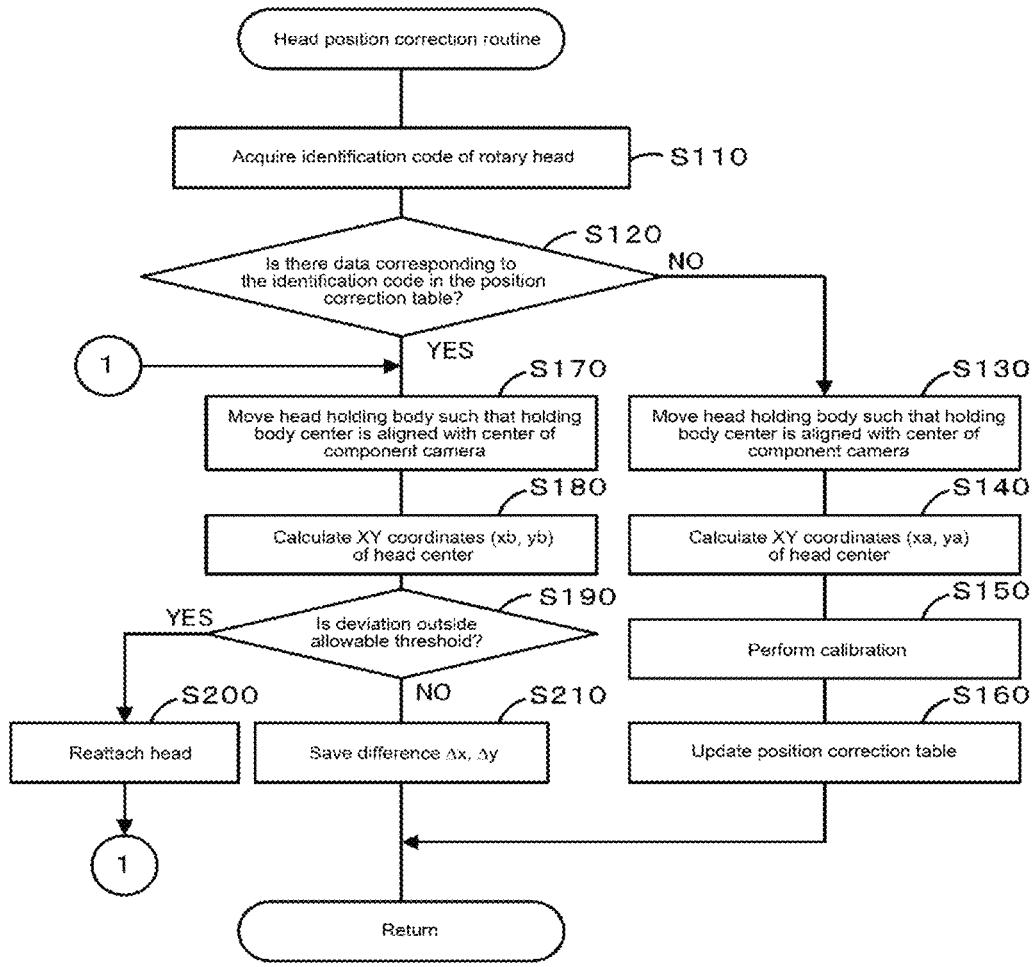
FIG. 6 is a flowchart of a head position correction routine.

Next, a head position correction routine executed by CPU 72 of controller 70 of component mounting device 10 will be described with reference to the flowchart of FIG. 6. The head position correction routine is a routine executed by CPU 72 each time rotary head 30 is mounted on head holder 54. There are multiple rotary heads 30 having the same structure and different lots. Further, in addition to a rotary head 30 having twelve nozzles 32a, there is a rotary head having four or eight nozzles. In each rotary head, a two-dimensional bar code indicating an individual identification code is attached to the upper face of a predetermined nozzle operation lever. Hereinafter, a case where rotary head 30 is mounted will be described, and the same applies when mounting other rotary heads.

First, CPU 72 acquires an identification code of the rotary head 30 to be mounted this time (S110). The identification code may be acquired by capturing an image of the two-dimensional bar code (not illustrated) which is attached to rotary head 30 using mark camera 56 and acquiring the code from the image, or the identification code of rotary head 30 may be acquired from management computer 80.

Next, CPU 72 determines whether the calibration data (position correction data) is associated with this identification code in a position correcting table 78a (see FIG. 1) of HDD 78 (S120). Every time CPU 72 executes the calibration, the identification code of the rotary head 30, the XY-coordinates of a head center PHa (head center PH at the time of calibration execution), and the calibration data at that time are preserved in the associated position correcting table 78a. Therefore, if a positive determination is made in step S120, then it means that the calibration has already been executed in the rotary head 30 of this identification code and if a negative determination is made in step S120, then it means that the calibration has not yet been executed.

Figure 7:
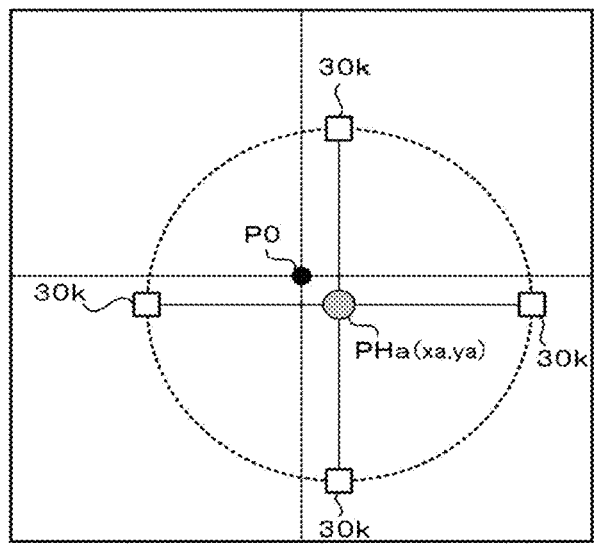
FIG. 7 is a captured image of the component camera when XY coordinates (xa, ya) of head center PHa are obtained.

If a negative determination is made in step S120, CPU 72 first controls X-axis and Y-axis sliders 22 and 26 so that the holder center P0 coincides with the center (referred to as the origin (0, 0) of the XY-coordinates) of component camera 58 (step S130). Accordingly, the holder center P0 coincides with the origin (0, 0). Subsequently, CPU 72 obtains XY-coordinates (xa, ya) of the head center PHa of the rotary head 30 (step S140). FIG. 7 illustrates a captured image taken by component camera 58 at this time. For example, the XY-coordinates (xa, ya) can be obtained by using pixels of the obtained image. Subsequently, CPU 72 executes the calibration (step S150), writes the obtained calibration data in the position correcting table 78a associated with this identification code and the XY-coordinates (xa, ya) of the head center PHa, such that the position correcting table 78a is updated (step S160). In the component mounting device 10, a component mounting program which mounts a component to a target position on the board S is created assuming that each member is manufactured or attached in advance as designed values. However, actually, it is rare that each member is manufactured or attached as designed values, and actually manufacture or attachment of the member deviates from the designed values. Therefore, in order to calibrate the deviation, the calibration of component mounting device 10 is executed. At the time of subsequent component mounting, CPU 72 reflects the result of this calibration and executes the component mounting. For a specific example of the calibration, see WO2015/049721, for example.

Figure 8:
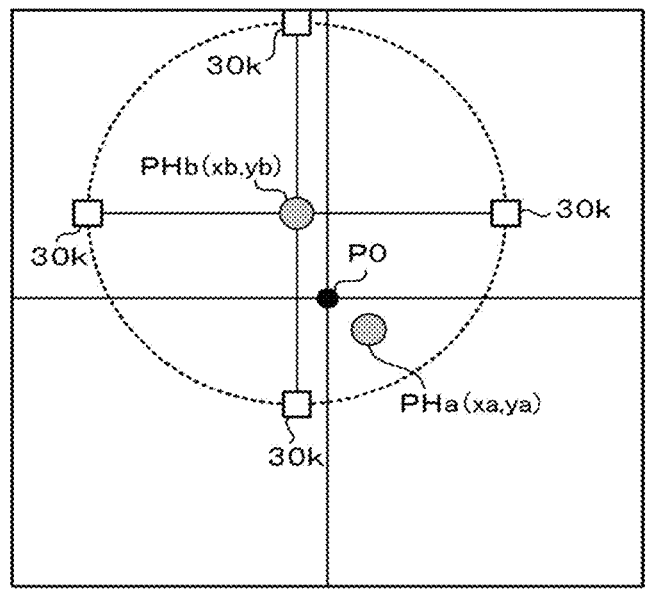
FIG. 8 is a captured image of the component camera when XY coordinates (xb, yb) of head center PHb are obtained.

On the other hand, if a positive determination is made in step S120, CPU 72 first controls X-axis and the Y-axis sliders 22 and 26 so that the holder center P0 coincides with the center of component camera 58 (step S170). Accordingly, the holder center P0 coincides with the origin (0, 0). Subsequently, CPU 72 obtains XY-coordinates (xb, yb) of a head center PHb of the rotary head 30 (step S180). FIG. 8 illustrates a captured image by component camera 58 at this time. Subsequently, CPU 72 determines whether the rotary head 30 held by head holder 54 deviates beyond the allowable range from a specified reference (step S190). Specifically, it is determined whether this head center PHb deviates beyond the allowable range from the head center PHa corresponding to this identification code in the position correcting table 78a. Here, the difference of the XY-coordinates, that is, $\Delta x=|xb-xa|$, $\Delta y=|yb-ya|$ is obtained and it is determined whether $\Delta x$ and $\Delta y$ also exceed a predetermined threshold value Xth and Yth. The component mounting precision is measured when actual component mounting is performed under various different conditions of $\Delta x$ and $\Delta y$ and the threshold values Xth and Yth are determined based on the measurement results of the component mounting accuracy. When the differences $\Delta x$ and $\Delta y$ increase, the holding state of rotary head 30 with respect to head holder 54 is greatly different from that when the calibration is performed and the possibility that rotary head 30 is inclined with respect to head holder 54 increases. In such a case, it can be considered that simple correction of the differences $\Delta x$ and $\Delta y$ makes it impossible to maintain the precision of component mounting due to the influence of the inclination.

If positive determination is made in step S190, that is, if rotary head 30 held by head holder 54 deviates from a specified reference beyond an allowable range, CPU 72 controls X-axis and Y-axis sliders 22 and 26 and head unit 20 (step S200) so that head holder 54 temporarily releases this holding of rotary head 30 and then holds rotary head 30 again (that is, grabs the head again) to execute again S170 and perform subsequent processes.

On the other hand, if negative determination is made in step S190, that is, if rotary head 30 held by head holder 54 is within an allowable range from a specified reference, CPU 72 preserves the differences $\Delta x$ and $\Delta y$ of the XY-coordinates to the HDD (Step S210) and then ends this routine. Thereafter, CPU 72 executes a component mounting program to be described below. At this time, when reading out and using the calibration data corresponding to this identification code from position correcting table 78a, CPU 72 adds the correction values based on the differences $\Delta x$ and $\Delta y$ of the XY-coordinates described above to the calibration data and uses the calibration data.

Next, component mounting processing executed by controller 70 after executing the head position correction routine described above will be described. CPU 72 of controller 70 reads the component mounting program from HDD 78 and executes a component mounting process based on the production job data received from management computer 80. Here, it is assumed that twelve nozzles 32a are ranked from a first nozzle to a twelfth nozzle.

First, CPU 72 causes the twelve nozzles 32a to pick up components. Specifically, CPU 72 controls X-axis slider 22 and the Y-axis slider 26 to dispose the first nozzle 32a directly above the desired component. Thereafter, CPU 72 controls a pressing mechanism (not illustrated) to press nozzle operation lever 39 of first nozzle 32a downward against the force of spring 40. Then, first nozzle 32a moves downward. At the same time, CPU 72 operates pressure operation lever 35 with a switching mechanism (not illustrated) to supply a negative pressure to first nozzle 32a. Accordingly, desired components are picked up by first nozzle 32a. Next, while rotating rotary head 30 together with head holder 4, CPU 72 controls the pressing mechanism (not illustrated) to return the first nozzle 32a to the regular position by the force of spring 40. Subsequently, CPU 72 presses nozzle operation lever 39 of second nozzle 32a downward against the force of spring 40 and controls the switching mechanism (not illustrated) to supply a negative pressure to second nozzle 32a. At this time, CPU 72 performs control so that the second nozzle 32a picks up the desired component. Similar operations are also repeated for the third and subsequent nozzles 32a. Accordingly, it is possible to pick up components using all the nozzles 32a, from first to last.

Thereafter, CPU 72 controls sliders 22 and 24 and head unit 20 so that the components are mounted on the target positions of the board S. Specifically, CPU 72 moves rotary head 30 right above component camera 58, analyzes the image captured by component camera 58 at this position, and recognizes the positional deviation amount of the components held by the first nozzle 32a to the twelfth nozzle 32a, respectively. Subsequently, CPU 72 causes the first nozzle 32a to move just above the target position of the first component of the board S, based on the correction values based on the positional deviation amount of the component, the calibration data, and the differences $\Delta x$ and $\Delta y$ of the XY-coordinates. Subsequently, CPU 72 controls the pressing mechanism (not illustrated) to lower nozzle operation lever 39 of the first nozzle 32a and then operates pressure operation lever 35 with the switching mechanism (not illustrated) to supply the atmospheric pressure to the first nozzle 32a. Accordingly, the component picked up by the first nozzle 32a is attached to the target position of the first component. Similarly, the components picked up by the second and subsequent nozzles 32a are mounted on the board S.

The rotary head may be automatically exchanged in the middle of CPU 72 performing the operation of mounting components on the board S. A case where it is necessary to automatically change the rotary head includes a case where there are many sizes of components to be mounted on the board S and thus one rotary head cannot deal with the components, or the like, for example. When such automatic exchange of the rotary head is performed, the head position correction routine described above is executed and then the component mounting process is executed again.

Here, the relationship between the constituent elements of this embodiment and the constituent elements of the invention will be clarified. Rotary head 30 of this embodiment corresponds to the head of the invention, head holder 54 corresponds to the head holding means, and CPU 72 corresponds to the control means. In addition, the re-grabbing of the head in step S200 corresponds to the process for the holding error.

In component mounting device 10 of an embodiment described above, if rotary head 30 held by head holder 54 greatly deviates from a specified reference, CPU 72 executes the process for the holding error. If the rotary head 30 greatly deviates from a specified reference and the component mounting process is executed as is, there is a fear that poor precision will occur during component mounting. Therefore, CPU 72 does not execute the component mounting process but executes the process for the holding error. Accordingly, if the rotary head 30 deviates greatly from a specified reference, poor precision during component mounting is prevented.

In addition, as the process for the holding error, the process of controlling head holder 54 so as to perform re-grabbing of rotary head 30 by head holder 54 is executed. Due to this re-grabbing, the deviation of rotary head 30 sometimes falls within an allowable range. If the deviation falls within the allowable range, poor precision does not occur when the component mounting process is subsequently executed.

Further, the XY-coordinates (xa, ya) of the head center PHa of rotary head 30 held by head holder 54 when the head position correction data was created was used as a reference at the time of measuring the deviation. Therefore, CPU 72 can grasp the deviation of the XY-coordinates (xb, yb) of this head center PHb with respect to the XY-coordinates (xa, ya) of the head center PHa.

It is to be understood that the invention is not in any way limited to the embodiment described above and can be implemented in various modes as long as the modes fall within the technical scope of the invention.

For example, in an embodiment described above, although the re-grabbing of rotary head 30 is performed as the process for the holding error, in place of or in addition to the process for the holding error, generation of the holding error may be output to a display of controller 70 as an image, may be output from a speaker as audio, or may be sent to he management computer 80. In this way, since an operator knows from the notification that a holding error has occurred, it is possible to properly take countermeasures against the holding error.

In an embodiment described above, although there is no particular limitation on the number of times to grab the rotary head 30 again, a limitation on the number of times may be added. For example, a step may be provided for determining whether the number of times of re-grabbing of rotary head 30 has reached a predetermined number before step S200. In this case, if the number of re-grabbing has not reached the predetermined number of times, CPU 72 proceeds to step S200 and if the number of re-grabbing has reached the predetermined number of times, the CPU 72 externally notifies the occurrence of the holding error and then may end this routine. In this way, it is possible to prevent the routine becoming stuck in a loop in a case where the deviation is not eliminated even when head holder 54 grabs rotary head 30 many times.

Figure 9:
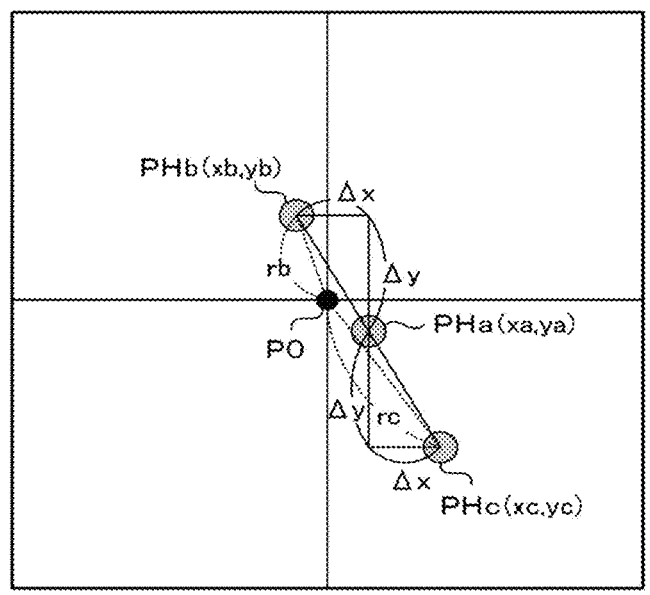
FIG. 9 is a captured image of the component camera illustrating a relationship between head center PHb and head center PHc.

In an embodiment described above, although the determination as to whether rotary head 30 held by head holder 54 deviates beyond the allowable range is performed by whether the differences Δx and Δy of the XY-coordinates of the head center PH exceed the allowable range, the invention is not particularly limited thereto. Although when R-shaft 54f of head holder 54 is rotated, rotary head 30 is also rotated, but if the radius of the circular orbit which is drawn by the head center PH of the rotary head 30 is larger than the allowable range, the influence of the eccentricity becomes large and the precision of component mounting decreases. For example, both the head center PHb and a head center PHc illustrated in FIG. 9 are assumed to have the same difference Δx, and Δy from the XY-coordinates (xa, ya) of the head center PHa at the time of calibration execution. However, with respect to the radius of the eccentricity, a radius rc of the head center PHc is larger than a radius rb of the head center PHb. Therefore, even if the differences Δx and Δy between the head center PHc and the XY-coordinates of the head center PHa at the time of calibration execution are within the allowable range, the eccentricity radius may be out of the allowable range in some cases. Because of this, in a case where the differences Δx and Δy are within the allowable range in step S190, the CPU 72 further determines whether the radius of the eccentricity is also larger than the allowable range, and if the radius of the eccentricity is also within the allowable range, negative determination is made in step S190 and the process proceeds to step S210, and if the radius of the eccentricity is larger than the allowable range, the process may proceed to step S200. The reference in this case is the holder center P0 of head holder 54 and CPU 72 can grasp the deviation of rotary head 30 with respect to head holder 54. The radius of the eccentricity may be obtained the distance from the holder center P0 (=center of component camera 58) to the head center PH or may be obtained from the orbit of the head center PH when R-shaft 54f makes one rotation. In addition, in step S190, it may be determined whether the radius of the eccentricity is larger than the allowable range.

In an embodiment described above, although whether rotary head 30 held by head holder 54 deviates beyond the allowable range is determined by the differences Δx and Δy of the XY-coordinates, the invention is not limited thereto. For example, it may be determined by the distance between two points, that is, $\{(xb-xa)^2+(yb-ya)^2\}^{1/2}$.

In an embodiment described above, although the reel unit including feeder 62 and reel 64 is described as an example of component supply device 60, the invention is not particularly limited to the reel unit. For example, instead of a reel unit, a well-known tray unit (for example, refer to JP-A-2011-060816) may be adopted, wherein a pallet on which a tray is placed is drawn out from a magazine, moved to a predetermined component supply position by a pallet drawer table drawing pallet such that the component may be picked up by the nozzle at the component supply position.

In the embodiment described above, although rotary head 30 is described, a head having one nozzle that is not a rotary head may be used.

INDUSTRIAL APPLICABILITY

The invention can be used in a component mounting device for mounting electronic components on a board.

REFERENCE SIGNS LIST 1 component mounting system, 10 component mounting device, 12 base, 13 head storage area, 14 board conveyance device, 16 support plate, 18 conveyor belt, 20 head unit, 22 X-axis slider, 24 guide rail, 26 Y-axis slider, 28 guide rail, 30 rotary head, 30k head mark, 32 nozzle holder, 32a nozzle, 33 cylindrical gear, 34 small gear, 35 pressure operation lever, 39 nozzle operation lever, 40 spring, 52 clutch member, 54 head holder, 54a R-shaft gear, 54b R-shaft motor, 54c Q-shaft gear, 54d Q-shaft motor, 54e clutch member, 54f R-shaft, 54g tubular protrusion, 54h hole, 54i clamp ball, 54j piston, 54k R-shaft mark, 56 mark camera 58 component camera, 60 component supply device, 62 feeder, 64 reel, 70 controller, 72 CPU, 74 ROM, 76 RAM, 78 HDD, 78a position correcting table, 80 management computer, P0 holder center, PH, PHa, PHb, PHc Head center.

The invention claimed is:
1. A component mounting device comprising:
   a head that includes a nozzle capable of picking up a component;
   a head holding means configured to hold and release the head, the head holding means being movable along an X-direction and along a Y-direction; and
   a control means configured to determine whether the head held by the head holding means deviates from a speci- fied reference beyond an allowable range by determining if a first difference between an X-coordinate of a head center and a target X-coordinate is greater than a first threshold value and determining if a second difference between a Y-coordinate of the head center and a target Y-coordinate is greater than a second threshold value, and execute a process for a holding error rather than a component mounting process if the deviation exceeds the allowable ramie.

2. The component mounting device according to claim 1, wherein the control means executes a process of controlling the head holding means so that the head holding means holds the head again, as the process for the holding error.

3. The component mounting device according to claim 1, wherein the control means executes a process of externally notifying the fact that the holding error has occurred, as the process for the holding error.

4. The component mounting device according to claim 1, wherein the specified reference is a specified position of the head holding means.

5. The component mounting device according to claim 1, wherein the specified reference is a specified position of the head held by the head holding means when head position correction data is created.

6. The component mounting device according to claim 1, further comprising a camera for capturing an image of the head for determining the X-coordinate and the Y-coordinate of the head center.

\* \* \* \* \*